(12) United States Patent
Carella et al.

(10) Patent No.: US 10,377,895 B2
(45) Date of Patent: Aug. 13, 2019

(54) CONDUCTIVE POLYMER OF POLY(THIO- OR SELENO-)PHENE TYPE

(71) Applicant: COMMISSARIAT A L'ENERGIE ATOMIQUE ET AUX ENERGIES ALTERNATIVES, Paris (FR)

(72) Inventors: Alexandre Carella, Mazeres-Lezons (FR); Nicolas Massonnet, Saint-Orens de Gameville (FR); Jean-Pierre Simonato, Sassenage (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 211 days.

(21) Appl. No.: 15/127,185

(22) PCT Filed: Mar. 19, 2015

(86) PCT No.: PCT/EP2015/055781
§ 371 (c)(1),
(2) Date: Sep. 19, 2016

(87) PCT Pub. No.: WO2015/140249
PCT Pub. Date: Sep. 24, 2015

(65) Prior Publication Data
US 2017/0107372 A1    Apr. 20, 2017

(30) Foreign Application Priority Data
Mar. 19, 2014    (FR) ..................... 14 52265

(51) Int. Cl.
| | | |
|---|---|---|
| C08L 65/00 | (2006.01) | |
| C08G 61/12 | (2006.01) | |
| H01B 1/12 | (2006.01) | |
| H01L 51/00 | (2006.01) | |
| C09D 5/24 | (2006.01) | |
| C09D 165/00 | (2006.01) | |
| C08K 3/24 | (2006.01) | |
| C08K 5/42 | (2006.01) | |
| C08L 71/02 | (2006.01) | |
| C08K 3/30 | (2006.01) | |

(52) U.S. Cl.
CPC ............ *C08L 65/00* (2013.01); *C08G 61/126* (2013.01); *C08K 3/24* (2013.01); *C08K 5/42* (2013.01); *C08L 71/02* (2013.01); *C09D 5/24* (2013.01); *C09D 165/00* (2013.01); *H01B 1/127* (2013.01); *H01L 51/0036* (2013.01); *H01L 51/0037* (2013.01); *C08G 2261/1424* (2013.01); *C08G 2261/3223* (2013.01); *C08G 2261/3242* (2013.01); *C08G 2261/3243* (2013.01); *C08G 2261/51* (2013.01); *C08G 2261/792* (2013.01); *C08K 2003/309* (2013.01); *C08L 2203/20* (2013.01); *Y02E 10/549* (2013.01)

(58) Field of Classification Search
CPC .............................. C08G 61/12; C08G 61/126
USPC ........................................... 528/377
See application file for complete search history.

(56) References Cited

U.S. PATENT DOCUMENTS 5,098,529 A    3/1992    Feldhues

FOREIGN PATENT DOCUMENTS

| CN | 102176103 A | 9/2011 |
|---|---|---|
| EP | 2161293 A1 | 3/2010 |

OTHER PUBLICATIONS

Jul. 20, 2015 International Search Report issued in International Patent Application No. PCT/EP2015/055781.
M.G. Medrano-Vaca et al. "Corrosion Protection of Carbon Steel by Thin Films of Poly (3-Alkyl Thiophenes) in 0.5 M H2SO4". Electrochimica Acta, Elsevier Science Publishers, Barking, GB, vol. 53, No. 9, Jan. 24, 2008, pp. 3500-3507.
Ouyang, Jianyong. "'Secondary Doping' Methods to Significantly Enhance the Conductivity of Pedot:PSS for Its Application As Transparent Electrode of Optoelectronic Devices". Displays Devices, vol. 34, No. 5, Aug. 30, 2013, pp. 423-436.
Bing Dong et al. "Electrosyntheses of Free-Standing and Highly Conducting Polyselenophene Films in an Ionic Liquid". Electrochimica Acta, Elsevier Science Publishers, Barking, GB, vol. 53, No. 19, Aug. 1, 2008, pp. 5745-5751.
Bongkoch Somboonsub et al. "Comparison of the Thermally Stable Conducting Polymers Pedot, PANi, and PPy Using Sulfonated Poly(Imide) Templates". Polymer, Elsevier Science Publishers B.V., GB, vol. 51, No. 20, Sep. 17, 2010, pp. 4472-4476.
L. Groenendaal et al. "Electrochemistry of Poly (3,4-Alkylenedioxythiophene) Derivatives". Advanced Materials, vol. 15, No. 11, Jun. 5, 2003, pp. 855-879.
Manrico V. Fabretto et al. "Polymeric Material With Metal-Like Conductivity for Next Generation Organic Electronic Devices". Chemistry of Materials, 2012, vol. 24, pp. 3998-4003.

(Continued)

*Primary Examiner* — Duc Truong
(74) *Attorney, Agent, or Firm* — Oliff PLC

(57) ABSTRACT

The present invention relates to a conductive polymer material of poly(thio- or seleno-)phene type containing at least two distinct species of counteranion, including a first species which is an anionic form of sulphuric acid, and a second species of counteranion selected from triflate, triflimidate, tosylate, mesylate, perchlorate and hexafluorophosphate. The invention also relates to a process for preparing such a material and the use thereof as conductive film. The invention also targets a substrate coated at least partly by a film of a material as defined above, a device comprising a material as defined above as conductive material, and also the use thereof in the organic electronics, organic thermoelectricity, organic photovoltaic and organic photodetector fields.

14 Claims, No Drawings

(56) References Cited

OTHER PUBLICATIONS

Teahoon Park et al. "Flexible Pedot Electrodes With Large Thermoelectric Power Factors to Generate Electricity by the Touch of Fingertips". Enegery & Environmental Science, 2013, vol. 6, No. 3, pp. 788-792.

CONDUCTIVE POLYMER OF POLY(THIO- OR SELENO-)PHENE TYPE

The present invention relates to a novel material based on poly(thio- or seleno)phenes and to a process for its preparation.

Devices such as organic electronic devices, organic photovoltaic devices, organic light-emitting diodes, organic thermoelectric devices or organic photodetectors are composed of electrodes employing conductive materials.

One generally popular material is indium tin oxide (ITO). It is advantageous, on the one hand, for its optical transparency and, on the other hand, for its high conductivity. Unfortunately, this material remains weak and it thus remains difficult to employ it in flexible devices. In addition, it is very expensive to supply with indium.

For these reasons, organic materials represent an advantageous alternative for replacing indium tin oxide in these devices.

In particular, poly(3,4-ethylenedioxythiophene) (PEDOT) and its derivatives are regarded as polymers exhibiting a high technological and commercial potential. This is because they are biocompatible and in addition have a good dynamic electrochromic activity and a good long-term stability in air.

However, these materials exhibit moderate conductivities.

Various routes have been explored in order to attempt to increase the conductivity of these materials.

A first option was proposed by Groenendaal et al., who developed the synthesis of conductive PEDOTs by electropolymerization of 3,4-ethylenedioxythiophene (EDOT). These materials are synthesized by liquid-phase electropolymerization of EDOT in a solution of salts in acetonitrile. PEDOT:triflate, PEDOT:triflimidate, PEDOT:perchlorate or PEDOT:hexafluorophosphate materials have thus been synthesized (Groenendaal et al., *Advanced Material*, 2003, 15(11), 855-879). However, the conductivity of these polymers remains too low. In addition, the process for the synthesis of these materials is not compatible with all the substrates on which the conductive material is deposited, which substrates have to be conductive in order to act as electrode during the polymerization.

Another possibility was described by Fabretto et al., synthesized PEDOT:OTs materials. The latter are prepared by oxidizing vapor-phase polymerization of EDOT by iron tristosylate Fe(OTs)$_3$ in a PEG-PPG-PEG matrix (Fabretto et al., *Chemistry of Materials*, 2012, 24, 3998-4003). However, the synthesis of these materials is very restricting and is not compatible with the high-throughput preparation of large surface areas.

More recently still, Park et al. developed conductive PEDOT:OTs materials for thermoelectric applications by solution polymerization. These PEDOTs are also synthesized by oxidizing liquid-phase polymerization of EDOT by iron tristosylate Fe(OTs)$_3$ in a PEG-PPG-PEG matrix. Pyridine is used as polymerization inhibitor (Park et al., *Energy & Environmental Science*, 2013, 6(3), 788). Nevertheless, the use of pyridine is restricting as it is very toxic and is thus not compatible with industrial production of this material.

Consequently, a need remains for novel highly conductive materials which can in addition be synthesized in a simple way suitable for industrial scale production.

Thus, according to one of its aspects, the invention relates to a conductive polymeric material of poly(thio- or seleno)phene type comprising at least two distinct kinds of counteranion with at least one of them being an anionic form of a sulfur-comprising acid.

Preferably, just one of the two kinds is an anionic form of a sulfur-comprising acid.

In particular, the invention relates to a conductive polymeric material of poly(thio- or seleno)phene type comprising at least two distinct kinds of counteranion, including a first kind which is an anionic form of sulfuric acid and a second kind of counteranion chosen from triflate, triflimidate, tosylate, mesylate, perchlorate and hexafluorophosphate.

Contrary to all expectation, the inventors have found that these polymeric materials exhibit a very high conductivity. Their use is thus particularly advantageous in organic electronic devices, organic photovoltaic devices, organic thermoelectric devices, organic light-emitting diodes or organic photodetectors.

In addition, their synthesis is easy and compatible with large scale production.

Thus, according to yet another of its aspects, the present invention relates to a process for the preparation of a material as defined above comprising at least the stages consisting in:

(a) having available a polymeric material of poly(thio- or seleno)phene type comprising at least one anionic entity chosen from triflate, triflimidate, tosylate, mesylate, perchlorate and hexafluorophosphate, (b) bringing said material into contact with an aqueous solution of a sulfur-comprising acid under conditions favorable to the immobilization of an anionic form of said acid within the polymeric material, and (c) having available said material comprising a first anionic entity chosen from triflate, triflimidate, tosylate, perchlorate and hexafluorophosphate and a second entity corresponding to an anionic form of said sulfur-comprising acid.

In particular, the material of stage (a) is obtained beforehand by polymerization in a solvent medium of thio- or selenophene monomer(s) in the presence of an oxidizing solution of iron(III) triflate, triflimidate, tosylate, mesylate, perchlorate or hexafluorophosphate and of an effective amount of block copolymer of polyethylene glycol-polypropylene glycol-polyethylene glycol (PEG-PPG-PEG) type and is purified by aqueous washing before it is employed in stage (b).

According to an advantageous alternative form, this material of stage (a) already appears on a support at the surface of which it has been formed beforehand by polymerization according to the process described in detail above.

The process according to the invention advantageously makes it possible to obtain highly conductive materials.

According to another of its aspects, the present invention relates to the use of a material according to the invention or obtained according to the process described above as conductive film.

According to yet another of its aspects, the present invention is targeted at a substrate coated at least in part with a film of a material according to the invention or obtained according to the process described above.

According to yet another of its aspects, the present invention relates to a device comprising, as conductor material, a material according to the invention or obtained according to the process described above.

According to another of its aspects, the present invention relates to the use of a material according to the invention or obtained according to the process described above or of a substrate according to the invention in the fields of organic electronics, organic thermoelectricity, organic photovoltaics and organic photodetectors.

Other advantages and characteristics will become apparent on reading the description and examples which follow.

Material

As mentioned above, a conductive polymeric material of poly(thio- or seleno)phene type according to the invention comprises at least two distinct kinds of counteranion with at least one of them being an anionic form of a sulfur-comprising acid.

According to a preferred embodiment, just one of the two kinds is an anionic form of a sulfur-comprising acid.

In a material according to the invention, the sulfur-comprising acid is chosen in particular from sulfuric acid, a sulfonic acid and a perfluorosulfonic acid.

Preferably, the sulfur-comprising acid is sulfuric acid.

According to another preferred embodiment, the second kind of counteranion is at least one anionic entity chosen from triflate, triflimidate, tosylate, mesylate, perchlorate and hexafluorophosphate and in particular triflate.

In particular, a conductive polymeric material of poly(thio- or seleno)phene type according to the invention comprises at least two distinct kinds of counteranion, including a first kind which is an anionic form of sulfuric acid and a second kind of counteranion chosen from triflate, triflimidate, tosylate, mesylate, perchlorate and hexafluorophosphate.

The use of triflate makes it possible to obtain films with very good conductive properties.

Thus, more preferably, a material according to the invention comprises at least hydrogensulfate and triflate counteranions.

According to a first alternative embodiment, the material according to the invention is based on a thiophene polymer deriving from the polymerization of monomer(s) chosen from thiophene, 3-alkylthiophenes, 3,4-dialkylthiophenes, 3,4-cycloalkylthiophenes, 3,4-dialkoxythiophenes and 3,4-alkylenedioxythiophenes, in which the alkyl groups, which are identical or different, are of formula $C_nH_{2n+1}$ with n between 1 and 12.

In particular, the material according to the invention is based on a thiophene polymer deriving from the polymerization of monomer(s) chosen from 3,4-dialkylthiophenes, 3,4-cycloalkylthiophenes, 3,4-dialkoxythiophenes and 3,4-alkylenedioxythiophenes, in which the alkyl groups, which are identical or different, are of formula $C_nH_{2n+1}$ with n between 1 and 12.

Thus, the thiophene polymer can, for example, be:

a poly(3,4-dialkylthiophene) of formula:

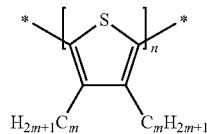

a poly(3,4-cycloalkylthiophene) of formula:

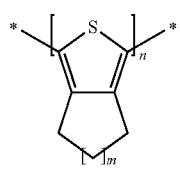

a poly(3,4-dialkoxythiophene) of formula:

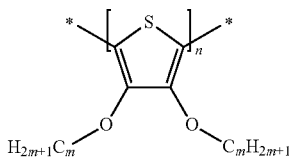

a poly(3,4-alkylenedioxythiophene) of formula:

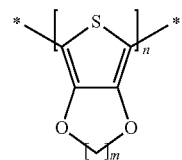

In particular, the monomers are chosen from thiophene, 3,4-ethylenedioxythiophene (EDOT), 3-hexylthiophene and 3,4-propylenedioxythiophene (PRODOT).

Preferably, the monomer is 3,4-ethylenedioxythiophene (EDOT).

Thus, the material according to the invention is preferably based on poly(3,4-ethylenedioxythiophene) (PEDOT).

According to a second alternative form of the invention, the material according to the invention is based on a selenophene polymer deriving from the polymerization of monomer(s) chosen from selenophene, 3-alkylselenophenes, 3,4-dialkylselenophenes, 3,4-cycloalkylselenophenes, 3,4-dialkoxyselenophenes and 3,4-alkylenedioxyselenophenes, in which the alkyl groups, which are identical or different, are of formula $C_nH_{2n+1}$ with n between 1 and 12.

In particular, the material according to the invention is based on selenophene polymer deriving from polymerization of monomer(s) chosen from 3,4-dialkylselenophenes, 3,4-cycloalkylselenophenes, 3,4-dialkoxyselenophenes and 3,4-alkylenedioxyselenophenes, in which the alkyl groups, which are identical or different, are of formula $C_nH_{2n+1}$ with n between 1 and 12.

The selenophene polymer can, for example, be:

a poly(3,4-dialkylselenophene) of formula:

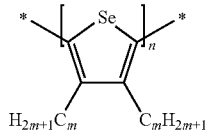

a poly(3,4-cycloalkylselenophene) of formula:

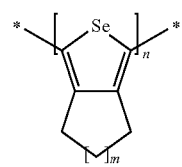

a poly(3,4-dialkoxyselenophene) of formula:

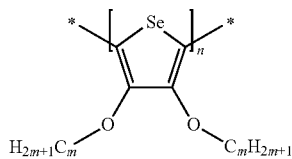

a poly(3,4-alkylenedioxyselenophene) of formula:

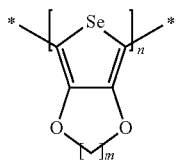

In particular, the monomers are chosen from selenophene, 3,4-ethylenedioxyselenophene (EDOS), 3-hexylselenophene and 3,4-propylenedioxyselenophene (PRODOS).

Preferably, a material according to the invention has a conductivity at least equal to 1000 S/cm and preferably varying from approximately 1500 S/cm to approximately 2500 S/cm, measured by the 4-point method, using a Loresta EP MCP-T360 conductivity meter.

Advantageously, a material according to the invention can be of use as conductive film.

Process

The present invention also relates to a process for the preparation of a material comprising at least the stages consisting in:

(a) having available a polymeric material of poly(thio- or seleno)phene type comprising at least one anionic entity chosen from triflate, triflimidate, tosylate, mesylate, perchlorate and hexafluorophosphate, (b) bringing said material into contact with an aqueous solution of a sulfur-comprising acid under conditions favorable to the immobilization of an anionic form of said acid within the polymeric material, and (c) having available said material comprising a first anionic entity chosen from triflate, triflimidate, tosylate, perchlorate and hexafluorophosphate and a second entity corresponding to an anionic form of said sulfur-comprising acid.

The operation in which the material is brought into contact with an aqueous solution of a sulfur-comprising acid can, for example, be carried out by immersing the material in a bath of the aqueous solution of sulfur-comprising acid.

Preferably, in a process according to the invention, the material of stage (a) is obtained beforehand by polymerization in a solvent medium of thio- or selenophene monomer(s) in the presence of an oxidizing solution of iron(III) triflate, triflimidate, tosylate, mesylate, perchlorate or hexafluorophosphate and of an effective amount of block copolymer of polyethylene glycol-polypropylene glycol-polyethylene glycol (PEG-PPG-PEG) type and is purified by aqueous washing before it is employed in stage (b).

More preferably, the material of stage (a) is obtained beforehand in the presence of an oxidizing triflate solution.

The block copolymer of polyethylene glycol-polypropylene glycol-polyethylene glycol (PEG-PPG-PEG) type advantageously makes it possible to inhibit the crystallization of the molecules of the oxidizing solution, to slow down the rate of polymerization and to increase the conductivity of the polymeric material.

Advantageously, the time during which the material is in contact with the aqueous solution of sulfur-comprising acid is greater than 10 minutes and preferably greater than 30 minutes.

According to an advantageous embodiment, the operation in which the material is brought into contact with the aqueous solution of sulfur-comprising acid is carried out at ambient temperature.

Preferably, the material is subsequently subjected to an annealing at a temperature of between 120° C. and 200° C., in particular of between 140° C. and 180° C. and preferably equal to 160° C.

According to an advantageous alternative embodiment, the polymeric material of stage (a) is provided in the form of a film appearing at the surface of a solid substrate.

Thus, according to another of its aspects, the present invention also relates to a process for increasing the conductivity of a polymeric material of poly(thio- or seleno)phene type comprising at least one anionic entity distinct from a sulfur-comprising acid, which is provided in the form of a film, appearing at the surface of a solid substrate, comprising the stage consisting in bringing said film into contact with an aqueous solution of a sulfur-comprising acid under conditions favorable to the immobilization of an anionic form of said acid within the polymeric material.

On conclusion of this stage, the film thus treated is dried.

According to a specific embodiment, the anionic entity distinct from a sulfur-comprising acid is chosen from triflate, triflimidate, tosylate, mesylate, perchlorate and hexafluorophosphate.

In particular, the present invention relates to a process for increasing the conductivity of a polymeric material of poly(thio- or seleno)phene type comprising at least one first kind of counteranion which is an anionic form of sulfuric acid and a second kind of counteranion chosen from triflate, triflimidate, tosylate, mesylate, perchlorate and hexafluorophosphate, which is provided in the form of a film, appearing at the surface of a solid substrate, comprising the stage consisting in bringing said film into contact with an aqueous solution of a sulfur-comprising acid under conditions favorable to the immobilization of an anionic form of said acid within the polymeric material.

Advantageously, the operation in which the film is brought into contact with the aqueous solution can be carried out by directly immersing the substrate in a bath of the aqueous solution of sulfur-comprising acid.

This substrate can in particular be as defined below.

Substrate

The present invention also relates to a substrate coated at least in part with a film of a material according to the invention or obtained according to the process according to the invention.

Preferably, the substrate is a substrate made of glass, of silicon, of woven material or of organic and/or polymeric nature, for example a substrate made of paper.

When it is of polymeric nature, the substrate can, for example, be made of polyethylene terephthalate (PEN), of polyethylene naphthalate (PET), of polyimide or of polytetrafluoroethylene (PTFE).

The examples which follow are presented by way of illustration and not of limitation of the field of the invention.

EXAMPLES

Example 1: Synthesis of PEDOT with Different Acid Treatments 2 ml of a 20% by weight solution of polyethylene glycol-polypropylene glycol-polyethylene glycol (PEG-PPG-PEG) (Mn=5800 g·mol$^{-1}$) in ethanol are prepared with stirring in an ultrasonic bath for 4 hours.

240 mg of Fe(OTf)$_3$ are added to the solution with stirring.

The solution is left stirring for an additional 30 minutes.

The solution is subsequently cooled to 5° C. and 20 µl of EDOT are added.

The solution is immediately placed in an ultrasonic bath at 5° C. for 1 minute.

The solution is spin coated onto a sheet of Corning Eagle XG glass (10×10 cm) and then annealed for 10 minutes on a heating plate at 70° C. in the open air.

The glass sheet is cut into 2.5×1.25 cm pieces and the conductivity of the films obtained is measured at 1200 S/cm (+/−20 S/cm) by 4-point measurement for a mean thickness of 70 nm (+/−5 nm).

These films are dipped in an acid bath at pH=1 for one hour and then dried on a heating plate at 160° C. for 30 minutes.

The conductivity of the films is measured by the Van der Pauw (4 point) method and compared with the value before acid treatment.

The values are collated in the table below.

| Sample | Conductivity (S/cm) | Acid treatment | Conductivity after treatment (S/cm) |
|---|---|---|---|
| 1 | 1207 | CF$_3$SO$_3$H (pH = 1) | 1376 |
| 2 | 1192 | HCl (pH = 1) | 341 |
| 3 | 1230 | HNO$_3$ (pH = 1) | 671 |
| 4 | 1215 | CH$_3$SO$_3$H (pH = 1) for 1 h | 1690 |
| 5 | 1220 | H$_2$SO$_4$ (pH = 1) for 1 h | 2541 |

It is noticed that samples 1, 4 and 5, which have been subjected to a treatment with a sulfur-comprising or sulfonic acid, exhibit very high conductivities after treatment, in contrast to samples 2 and 3, which were treated with HCl or HNO$_3$.

Example 2: Synthesis of Highly Conductive PEDOT:HSO$_4$ 2 ml of a 20% by weight solution of PEG-PPG-PEG (Mn=5800 g·mol$^{-1}$) in ethanol are prepared with stirring in an ultrasonic bath for 4 hours.

240 mg of Fe(OTf)$_3$ are added to the solution with stirring.

The solution is left stirring for an additional 30 minutes.

The solution is subsequently cooled to 5° C. and 20 µl of EDOT are added.

The solution is immediately placed in an ultrasonic bath at 5° C. for 1 minute.

The solution is spin coated onto a sheet of Corning Eagle XG glass (10×10 cm) and then annealed for 10 minutes on a heating plate at 70° C. in the open air.

The glass sheet is cut into 2.5×1.25 cm pieces and the conductivity of the films obtained is measured at 1200 S/cm (+/−20 S/cm) by 4-point measurement for a mean thickness of 70 nm (+/−5 nm).

These films are dipped in a bath of sulfuric acid at pH=1 for a predetermined period of time (1 min, 10 min, 30 min, 1 h, 2 h, 5 h or 24 h) and then dried on a heating plate at 160° C. for 30 minutes.

The conductivity of the films is measured by the Van der Pauw (4 point) method and compared with the value before acid treatment.

The values are collated in the table below.

| Sample | Conductivity (S/cm) | Acid treatment | Conductivity after treatment (S/cm) |
|---|---|---|---|
| 6 | 1262 | H$_2$SO$_4$ (pH = 1) for 1 min | 1450 |
| 7 | 1189 | H$_2$SO$_4$ (pH = 1) for 10 min | 1806 |
| 8 | 1189 | H$_2$SO$_4$ (pH = 1) for 30 min | 2502 |
| 9 | 1301 | H$_2$SO$_4$ (pH = 1) for 1 h | 2480 |
| 10 | 1338 | H$_2$SO$_4$ (pH = 1) for 2 h | 2512 |
| 11 | 1186 | H$_2$SO$_4$ (pH = 1) for 24 h | 2521 |

All of the samples treated with H$_2$SO$_4$ have very high conductivities after treatment. The conductivities after acid treatment are all the higher when the treatment time is greater than 30 minutes.

Example 3: Synthesis of Highly Conductive PEDOT:HSO$_4$ 2 ml of a 20% by weight solution of PEG-PPG-PEG (Mn=5800 g·mol$^{-1}$) in ethanol are prepared with stirring in an ultrasonic bath for 4 hours.

240 mg of Fe(OTf)$_3$ are added to the solution with stirring.

The solution is left stirring for an additional 30 minutes.

The solution is subsequently cooled to 5° C. and 20 µl of EDOT are added.

The solution is immediately placed in an ultrasonic bath at 5° C. for 1 minute.

The solution is spin coated onto a sheet of Corning Eagle XG glass (10×10 cm) and then annealed for 10 minutes on a heating plate at 70° C. in the open air.

The glass sheet is cut into 2.5×1.25 cm pieces and the conductivity of the films obtained is measured at 1200 S/cm (+/−20 S/cm) by 4-point measurement for a mean thickness of 70 nm (+/−5 nm).

These films are dipped in a bath of sulfuric acid at pH=1 for 30 minutes and then dried on a heating plate at different temperatures (140° C., 160° C. or 180° C.) for 30 minutes.

The conductivity of the films is measured by the Van der Pauw (4 point) method and compared with the value before acid treatment.

The values are collated in the table below.

| Sample | Conductivity (S/cm) | Acid treatment | Conductivity after treatment (S/cm) |
|---|---|---|---|
| 12 | 1238 | H$_2$SO$_4$ (pH = 1) at 140° C. | 1920 |
| 13 | 1276 | H$_2$SO$_4$ (pH = 1) at 160° C. | 2520 |
| 14 | 1286 | H$_2$SO$_4$ (pH = 1) at 180° C. | 1723 |

-continued

| Sample | Conductivity (S/cm) | Acid treatment | Conductivity after treatment (S/cm) |
|---|---|---|---|
| 15 | 1238 | H$_2$SO$_4$ (pH = 1) at 200° C. | 1453 |

All of the samples treated with H$_2$SO$_4$ have very high conductivities after treatment. The conductivities after acid treatment are all the higher when the treatment temperature is 160° C.

Example 4: Synthesis of Highly Conductive PRODOT:HSO$_4$ 2 ml of a 20% by weight solution of PEG-PPG-PEG (Mn=5800 g·mol$^{-1}$) in ethanol are prepared with stirring in an ultrasonic bath for 4 hours.

240 mg of Fe(OTf)$_3$ are added to the solution with stirring.

The solution is left stirring for an additional 30 minutes.

The solution is subsequently cooled to 5° C. and 25 µl of 3,4-propylenedioxythiophene (PRODOT) are added.

The solution is immediately placed in an ultrasonic bath at 5° C. for 1 minute.

The solution is spin coated onto a sheet of Corning Eagle XG glass (2.5×2.5 cm) and then annealed for 10 minutes on a heating plate at 70° C. in the open air.

The film is dipped in a bath of sulfuric acid at pH=1 for 30 minutes and then dried on a heating plate at 160° C. for 30 minutes.

The conductivity of the film, measured by the Van der Pauw (4 point) method, is 1500 S·cm$^{-1}$ and its thickness is 70 nm (+/−5 nm).

Example 5: Synthesis of Highly Conductive PEDOS:HSO$_4$ 2 ml of a 20% by weight solution of PEG-PPG-PEG (Mn=5800 g·mol$^{-1}$) in ethanol are prepared with stirring in an ultrasonic bath for 4 hours.

240 mg of Fe(OTf)$_3$ are added to the solution with stirring.

The solution is left stirring for an additional 30 minutes.

The solution is subsequently cooled to 5° C. and 25 µl of 3,4-ethylenedioxyselenophene (EDOS) are added.

The solution is immediately placed in an ultrasonic bath at 5° C. for 1 minute.

The solution is spin coated onto a sheet of Corning Eagle XG glass (2.5×2.5 cm) and then annealed for 10 minutes on a heating plate at 70° C. in the open air.

The film is dipped in a bath of sulfuric acid at pH=1 for 30 minutes and then dried on a heating plate at 160° C. for 30 minutes.

The conductivity of the film, measured by the Van der Pauw (4 point) method, is 1650 S·cm$^{-1}$ and its thickness is 70 nm (+/−5 nm).

Example 6: Synthesis of Highly Conductive PEDOT:HSO$_4$ from PEDOT:OTs 2 ml of a 20% by weight solution of PEG-PPG-PEG (Mn=5800 g·mol$^{-1}$) in ethanol are prepared with stirring in an ultrasonic bath for 4 hours.

240 mg of Fe(OTf)$_3$ are added to the solution with stirring.

The solution is left stirring for an additional 30 minutes.

The solution is subsequently cooled to 5° C. and 20 µl of 3,4-ethylenedioxythiophene (EDOT) are added.

The solution is immediately placed in an ultrasonic bath at 5° C. for 1 minute.

The solution is spin coated onto a sheet of Corning Eagle XG glass (2.5×2.5 cm) and then annealed for 10 minutes on a heating plate at 70° C. in the open air.

The film is dipped in a bath of sulfuric acid at pH=1 for 30 minutes and then dried on a heating plate at 160° C. for 30 minutes.

The conductivity of the film, measured by the Van der Pauw (4 point) method, is 1750 S·cm$^{-1}$ and its thickness is 70 nm (+/−5 nm).

The invention claimed is:

1. A conductive polymeric material including a poly(thio or seleno)phene type polymer comprising at least two distinct kinds of counteranions, including a first kind of counteranion which is an anionic form of sulfuric acid, and a second kind of counteranion selected from the group consisting of triflate and triflimidate.

2. The material as claimed in claim 1, comprising at least hydrogensulfate and triflate counteranions.

3. The material as claimed in claim 1, wherein the poly(thio or seleno)phene type polymer is a thiophene type polymer obtained by polymerizing at least one monomer selected from the group consisting of thiophene, 3-alkylthiophenes, 3,4-dialkylthiophenes, 3,4-cycloalkylthiophenes, 3,4-dialkoxythiophenes, and 3,4-alkylenedioxythiophenes, where the alkyl groups, if present, in the at least one monomer are: (i) identical or different, and (ii) represented by formula $C_nH_{2n+1}$ with n between 1 and 12.

4. The material as claimed in claim 1, wherein the poly(thio or seleno)phene type polymer is a thiophene type polymer obtained by polymerizing at least one monomer selected from the group consisting of thiophene, 3,4-ethylenedioxythiophene (EDOT), 3-hexylthiophene, and 3,4-propylenedioxythiophene (PRODOT).

5. The material as claimed in claim 1, wherein the poly(thio or seleno)phene type polymer is poly(3,4-ethylenedioxythiophene) (PEDOT).

6. The material as claimed in claim 1, wherein the poly(thio or seleno)phene type polymer is a selenophene type polymer obtained by polymerizing at least one monomer selected from the group consisting of selenophene, 3-alkylselenophenes, 3,4-dialkylselenophenes, 3,4-cycloalkylselenophenes, 3,4-dialkoxyselenophenes, and 3,4-alkylenedioxyselenophenes, where the alkyl groups, if present, in the at least one monomer are: (i) identical or different, and (ii) represented by formula $C_nH_{2n+1}$ with n between 1 and 12.

7. The material as claimed in claim 1, wherein the poly(thio or seleno)phene type polymer is a selenophene type polymer obtained by polymerizing at least one monomer selected from the group consisting of selenophene, 3,4-ethylenedioxyselenophene (EDOS), 3-hexylselenophene, and 3,4-propylenedioxyselenophene (PRODOS).

8. The material as claimed in claim 1, having a conductivity at least equal to 1000 S/cm, measured by the 4-point method, using a Loresta EP MCP-T360 conductivity meter.

9. A process for increasing the conductivity of a polymeric material including a poly(thio or seleno)phene type polymer comprising at least one first kind of counteranion which is an anionic form of sulfuric acid, and a second kind of counteranion chosen from triflate and triflimidate, wherein the polymeric material is provided in the form of a film on a surface of a solid substrate, the process comprising contacting said film with an aqueous solution of a sulfur-comprising acid under conditions favorable to the immobilization of an anionic form of said acid within the polymeric material.

10. A method for obtaining a conductive film, comprising coating a substrate with the material as claimed in claim 1.

11. A substrate coated at least in part with a film including the material as claimed in claim 1.

12. The substrate as claimed in claim 11, wherein the substrate is made of at least one material selected from the group consisting of glass, silicon, woven material, organic material, and polymeric material.

13. A device comprising, as conductor material, the material as claimed in claim 1.

14. The material as claimed in claim 1, having a conductivity varying from approximately 1500 S/cm to approximately 2500 S/cm, measured by the 4-point method, using a Loresta EP MCP-T360 conductivity meter.

* * * * *